United States Patent
Fukagawa

(10) Patent No.: US 6,854,105 B2
(45) Date of Patent: Feb. 8, 2005

(54) CHIP ARRANGEMENT DETERMINING APPARATUS AND METHOD

(75) Inventor: Youzou Fukagawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/376,238

(22) Filed: Mar. 3, 2003

(65) Prior Publication Data

US 2003/0172365 A1 Sep. 11, 2003

(30) Foreign Application Priority Data

Mar. 6, 2002 (JP) ........................................ 2002-060902

(51) Int. Cl.$^7$ .............................................. G06F 17/50
(52) U.S. Cl. ............................. 716/19; 716/21; 716/20
(58) Field of Search ................................ 716/19–21, 1, 716/3, 4; 430/5, 22, 30; 438/106, 108, 110, 763

(56) References Cited

U.S. PATENT DOCUMENTS 5,680,588 A * 10/1997 Gortych et al. ............... 716/19
6,546,543 B1 * 4/2003 Manabe et al. ............... 716/21
2002/0111038 A1 * 8/2002 Matsumoto et al. ......... 438/763
2003/0224557 A1 * 12/2003 Koduri et al. ............... 438/110

FOREIGN PATENT DOCUMENTS

JP 2000-195824 7/2000

* cited by examiner

Primary Examiner—A. M. Thompson
Assistant Examiner—Binh Tat
(74) Attorney, Agent, or Firm—Fitzpatrick, Cella, Harper & Scinto

(57) ABSTRACT

A method for determining a chip arrangement on a wafer. The method includes steps of generating a grid array in which rectangles are arranged in a grid pattern, the rectangle corresponding to a chip in size, an apex of the rectangle being a grid point, extracting a plurality of the grid points, having respective distances, from an origin, not greater than a constant defined by an available area on the wafer, from the grid array, forming a region, of which a form corresponds to the available area and which has the original and one of the extracted grid points on its circumference, on the grid array, with respect to each of the plurality of the grid points extracted in the extracting step, and determining a chip arrangement on the wafer based on a region, which includes a maximum number of the rectangles, formed in the forming step.

16 Claims, 18 Drawing Sheets

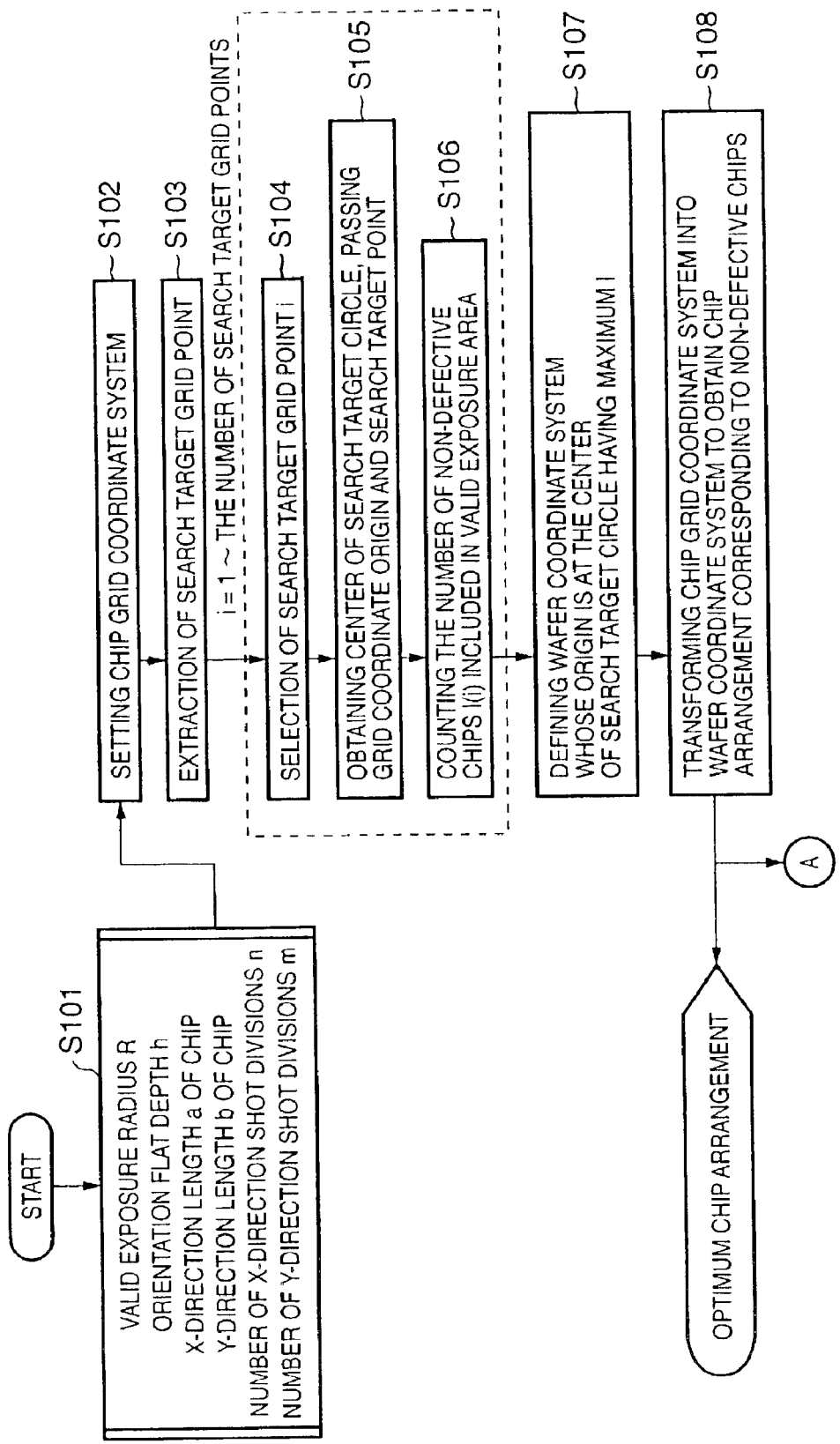

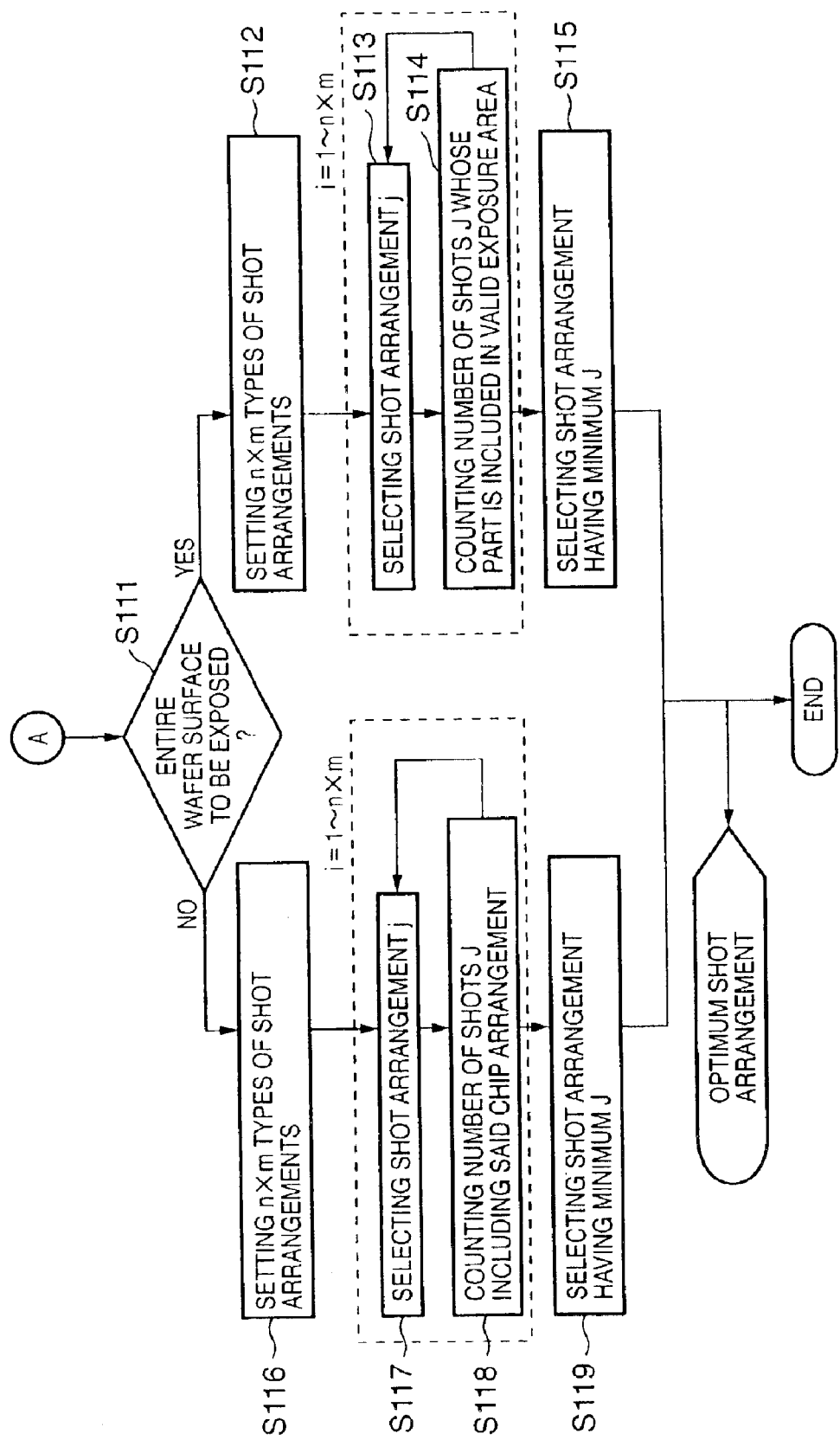

F I G. 14A 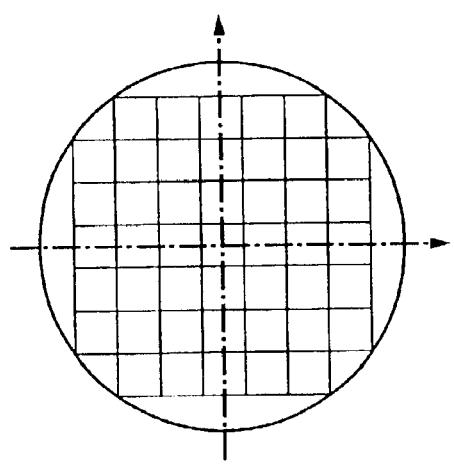
F I G. 14B 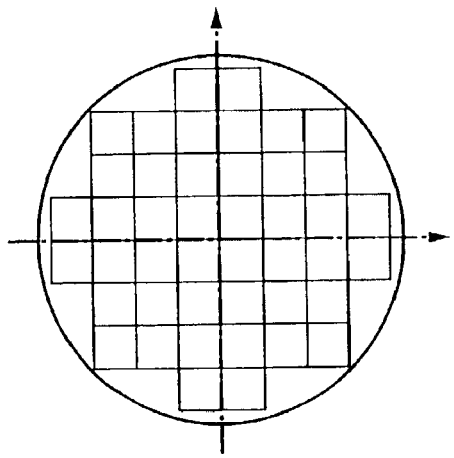

CHIP ARRANGEMENT DETERMINING APPARATUS AND METHOD

FIELD OF THE INVENTION

The present invention relates to a method and an apparatus for determining a chip arrangement, or a chip arrangement and a shot arrangement on a wafer for exposure processing performed by an aligner, which manufactures, e.g., semiconductor devices, image sensing devices (CCDs, or the like), liquid crystal display devices, thin-film magnetic heads, and the like, and also relates to an aligner which performs exposure processing using the method and the apparatus.

BACKGROUND OF THE INVENTION

Chips are arranged in a grid pattern on a wafer since it is necessary to provide scrub lines between the chips.

According to a conventional chip arrangement determining method, a chip arrangement shown in FIG. 14A, where the center of the chips matches the center of the wafer, is compared with a chip arrangement shown in FIG. 14B, where two sides of a chip match the wafer coordinate axes having its origin at the center of the wafer. Then, the arrangement that can achieve a larger number of acquirable chips in a valid exposure area is adopted.

The larger the number of chips produced from one wafer, the more the manufacturing cost can be reduced. Therefore, it is important to maximize the number of acquirable chips in the valid exposure area. However, the conventional technique shown in FIGS. 14A and 14B cannot determine a chip arrangement that achieves rigorously the maximum number of chips. Furthermore, Japanese Patent Application Laid-Open No. 2000-195824 proposes a chip arrangement determining method that achieves virtually the maximum number of chips. According to the method proposed by Japanese Patent Application Laid-Open No. 2000195824, the relative position of the valid exposure area and chip arrangement that is neatly arranged in a grid pattern is shifted in each of the X and Y directions to search for a relative position that maximizes the number of acquirable chips.

However, according to this method, unless the pitch of one shift is made infinitely small, it is not always possible to obtain the relative position that maximizes the number of acquirable chips. In addition, this method raises a problem of an increased calculation time, as the pitch is made smaller. In other words, to obtain a strictly optimum chip arrangement, the required calculation time becomes extremely long.

SUMMARY OF THE INVENTION

The present invention has been proposed to solve the above conventional problems, and has as its object to provide a method of obtaining a strictly optimum arrangement of semiconductor chips in a short time.

Furthermore, in a case wherein a plurality of chips are projected by a single time of an exposure shot, it is another object of the present invention to provide a determining method of a shot arrangement that realizes a high throughput by transferring a predetermined chip arrangement in the minimum number of shots, and a determining method of a shot arrangement that realizes a high throughput by exposing the entire surface of a valid exposure area in the minimum number of shots while covering the predetermined chip arrangement.

In order to attain the above objects, the present invention provides a chip arrangement determining method for obtaining a group of chips acquirable from a substantially circular wafer, the method comprising: an extracting step of extracting plural pairs of grid points, having a space smaller than a diameter of a regional circle, which is indicative of a size of a valid exposure area, from chip arrays where chips are arranged in a grid pattern; a forming step of forming a regional circle, having a pair of grid points on its circumference, on the chip arrays with respect to each of the plural pairs of grid points extracted in the extracting step; and a determining step of specifying a regional circle, having the maximum number of chips entirely included within the circle, from the regional circles formed in the forming step, and determining a chip arrangement on the wafer based on chip arrays of the specified regional circle.

In order to attain the above objects, the present invention provides a chip arrangement determining apparatus for obtaining a group of chips acquirable from a substantially circular wafer, the apparatus comprising: extracting means adapted to extract plural pairs of grid points, having a space smaller than a diameter of a regional circle, which is indicative of a size where chips are arranged in a grid pattern; forming means adapted to form a regional circle, having a pair of grid points on its circumference, on the chip arrays with respect to each of the plural pairs of grid points extracted by the extracting means; and determining means adapted to specify a regional circle, having the maximum number of chips entirely included within the circle, from the regional circles formed by the forming means, and to determine a chip arrangement on the wafer based on chip arrays of the specified regional circle.

More preferably, the above chip arrangement determining method further comprises a second determining step of determining an arrangement of a shot region in a manner such that the entire chip arrangement determined in the determining step is covered in the minimum number of shots.

Furthermore, the present invention provides a chip arrangement determining apparatus which executes the above-described chip arrangement determining method. Moreover, the present invention provides a semiconductor aligner comprising the chip arrangement determining apparatus, a semiconductor device manufactured by the semiconductor aligner, and a semiconductor device manufacturing method using the semiconductor aligner.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1A is a flowchart explaining an optimization procedure of a chip arrangement and a shot arrangement;

FIG. 1B is a flowchart explaining an optimization procedure of a chip arrangement and a shot arrangement;

FIGS. 14A and 14B are views showing an example of a conventional chip arrangement determining method;

DETAILED DESCRIPTION OF THE PREFERRED EMBODIMENTS

Preferred embodiments of the present invention will now be described in detail in accordance with the accompanying drawings.

<Chip Arrangement/Shot Arrangement Determining Process>

Figure 1C:
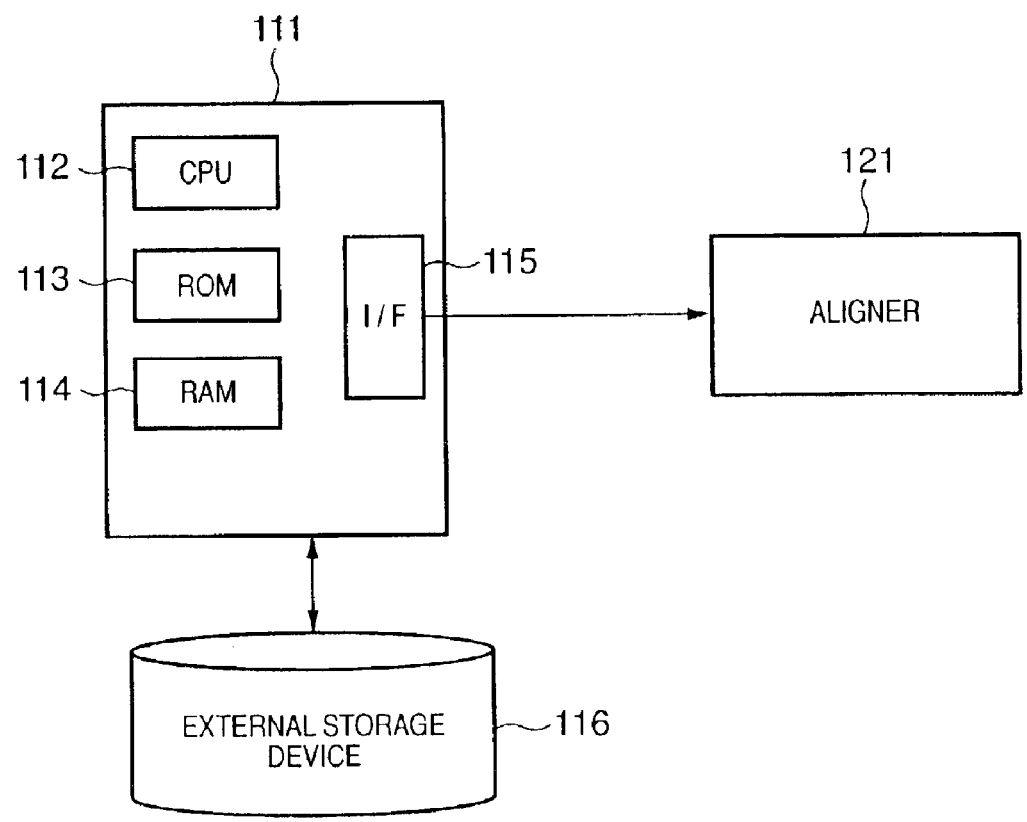
FIG. 1C is a block diagram showing a configuration of an apparatus which executes the procedure explained in FIGS. 1A and 1B.

FIG. 1C is a block diagram showing a configuration of an exposure system according to the present embodiment. Reference numeral 111 denotes a data processing apparatus, comprising a CPU 112 similar to that of a general-purpose computer, a ROM 113, a RAM 114, and an external storage device 116. Reference numeral 115 denotes an interface for communication between the data processing apparatus 111 and an aligner 121.

The data processing apparatus 111 determines the optimum chip arrangement and shot arrangement for a wafer based on job data for the aligner 121, which is stored in the external storage device 116, and informs the aligner 121 of the job data including the chip arrangement and shot arrangement. The aligner 121, which receives the job data, performs exposure processing on the wafer using the designated chip arrangement and shot arrangement.

Note that although this embodiment describes the data processing apparatus 111 and aligner 121 as independent apparatuses, the aligner 121 may include a part of or all of the functions of the data processing apparatus 111 described in this embodiment.

FIGS. 1A and 1B are flowcharts explaining chip arrangement/shot arrangement determining procedures according to this embodiment. The procedure shown in FIGS. 1A and 1B are realized by the CPU 112, which executes a control program stored in the ROM 113 or a control program loaded from the external storage device 116, to the RAM 114.

First, in step S101, data such as a valid exposure radius R of a wafer subjected to exposure, a depth h of an orientation flat, an X-direction length a of a chip, a Y-direction length b of a chip, the number of X-direction shot divisions n, the number of Y-direction shot divisions m, and the like, are inputted. In this embodiment, a chip arrangement that maximizes the number of acquirable chips is obtained based on the above data (S102 to S108). Next, in accordance with performing or not performing a full exposure of a valid exposure area of a wafer, a shot arrangement that can minimize the necessary number of shots is obtained (S111 to S119). Note that values set in step S101 may be acquired from the external storage device 16, or inputted by a user through an operation panel (not shown).

First, a description is provided of a method of obtaining a chip arrangement that maximizes the number of acquirable chips.

Figure 2:
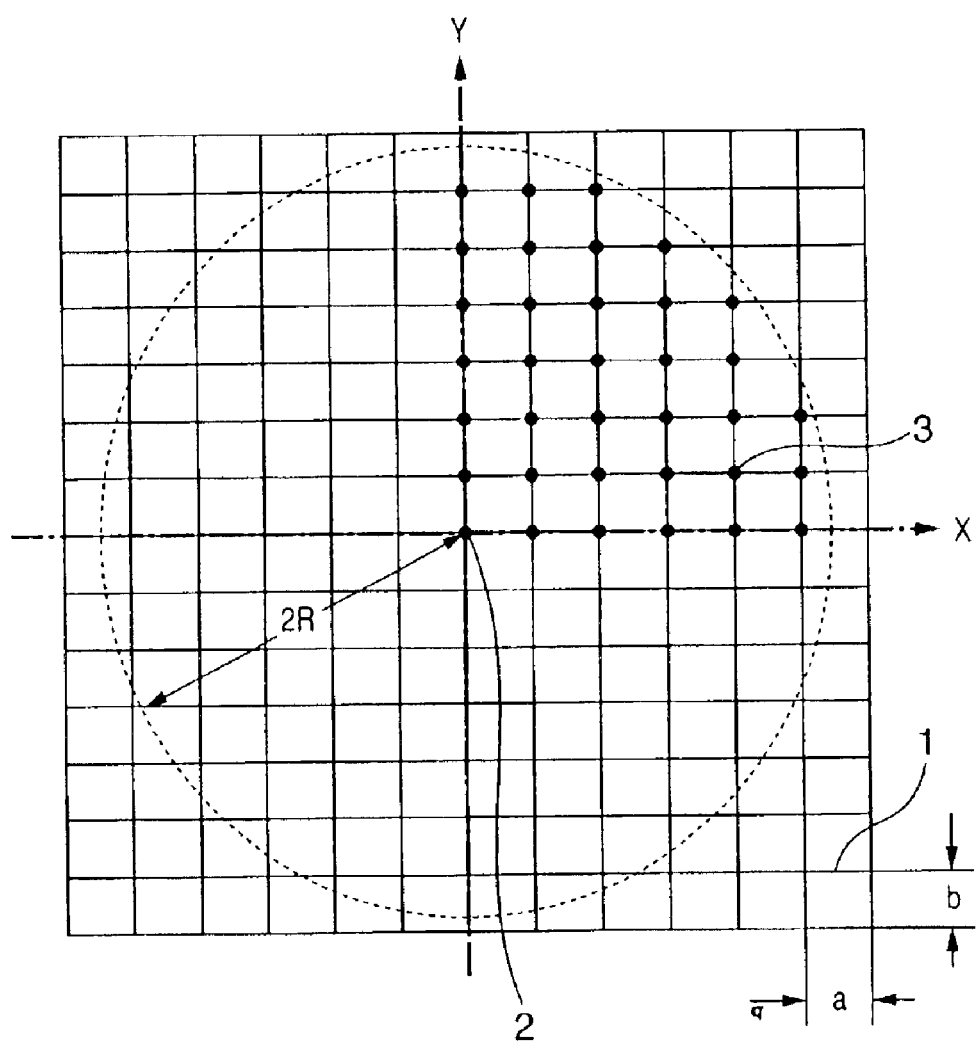
FIG. 2 is an explanatory view of a determining method of search target grid points.

In step S102, a chip grid coordinate system is set. Herein, rectangular chips 1, each having a length a in the X direction and a length b in the Y direction, which are arranged neatly in a grid pattern as shown in FIG. 2, are defined as the chip grid coordinate system. The chip grid coordinate system is configured with straight lines arranged in parallel with the Y axis at equal intervals a, and straight lines arranged in parallel with the X axis at equal intervals b.

Next, in step S103, search target grid points are extracted. In this embodiment, search target grid points 3 are defined by selecting grid points in the first quadrant which fall within the region from the original 2 to 2R of the chip grid coordinate system. Note that R, which is set in step S101, corresponds to the radius of a circle that covers the entirety of or a part of the boundary line of the valid exposure.

Figure 3:
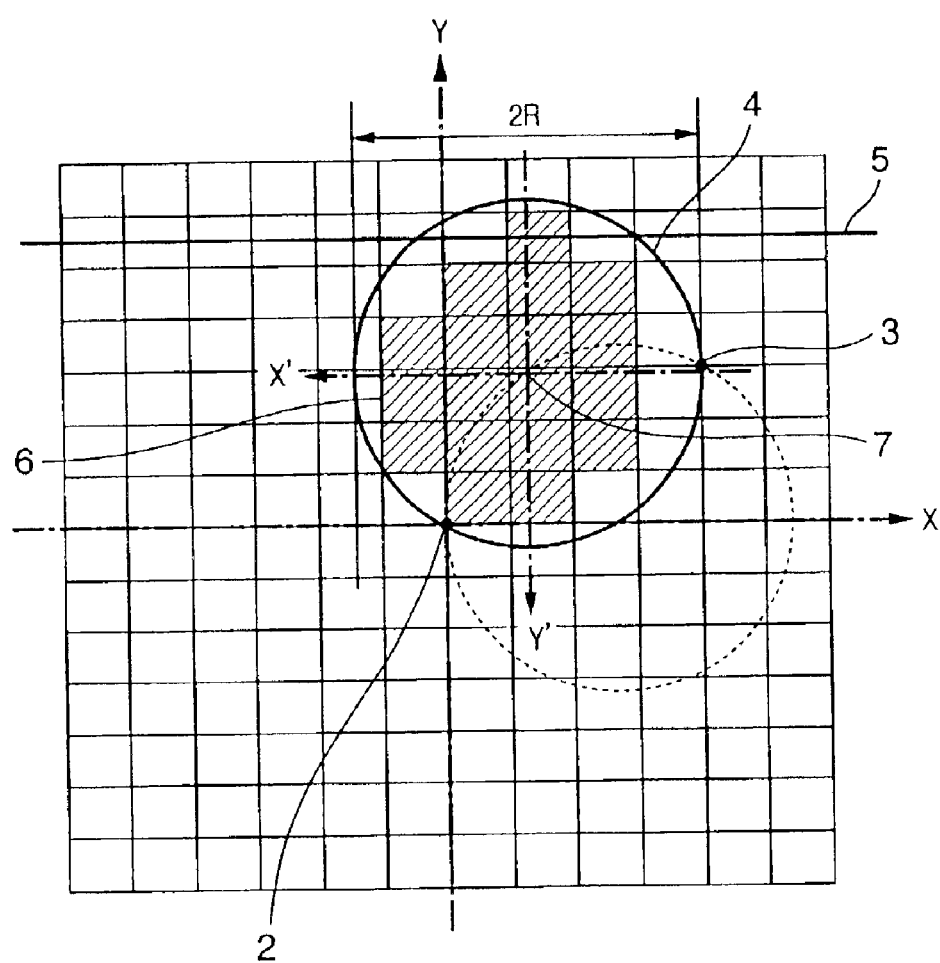
FIG. 3 is an explanatory view of a chip arrangement for each search target circle.

Next, in step S104, one grid point is selected from the aforementioned search target grid points 3. As shown in FIG. 3, the selected search target grid point 3 and the origin 2 are positioned on the circumference of the circle having the radius R. Accordingly, in step S105, it is possible to obtain the center position of the circle (hereinafter referred to as a search target circle), having the radius R, which includes the grid coordinate's origin and the search target grid point on its circumference. Note, as shown in FIG. 3, there are two search target circles for each search target grid point 3. The present embodiment defines, as a search target circle 4, a circle having a smaller X coordinate or a larger Y coordinate with respect to the center position coordinates of the circle; thus, each search target grid point 3 corresponds to a search target circle 4 on a one-to-one basis.

When an orientation flat exists for the search target circle 4, based on the depth h of the orientation flat, a notch-like boundary line 5 corresponding to an orientation flat is provided at, for instance, a position parallel with the X axis and having a larger Y coordinate than the center position of the search target circle. In this manner, the area which has a smaller Y coordinate than the boundary line 5 and which falls within the search target circle 4 is defined as the valid exposure area. In step S106, the number of chips 6 that are entirely included within the valid exposure area is counted to obtain the number of acquirable chips. Note in a case where the orientation flat does not exits (e.g., h=0), the entire search target circle is defined as a valid area.

The foregoing steps S104 to S106 are executed with respect to all the search target grid points, and the search target circle 4 that maximizes the number of acquirable chips is obtained (step S107). Then, the positions of the acquirable chips are transformed into the X'Y' wafer coordinate system 7, whose origin is at the center of the search target circle, thereby obtaining the strictly optimum chip arrangement. At this stage, the group of acquirable chips is defined as a non-defective chip group 8.

Next, a description is provided of a method of obtaining a shot arrangement for exposing the non-defective chip group 8 in the minimum number of shots, in a case wherein a plurality of chips are projected by a single time of an exposure shot.

Figure 4:
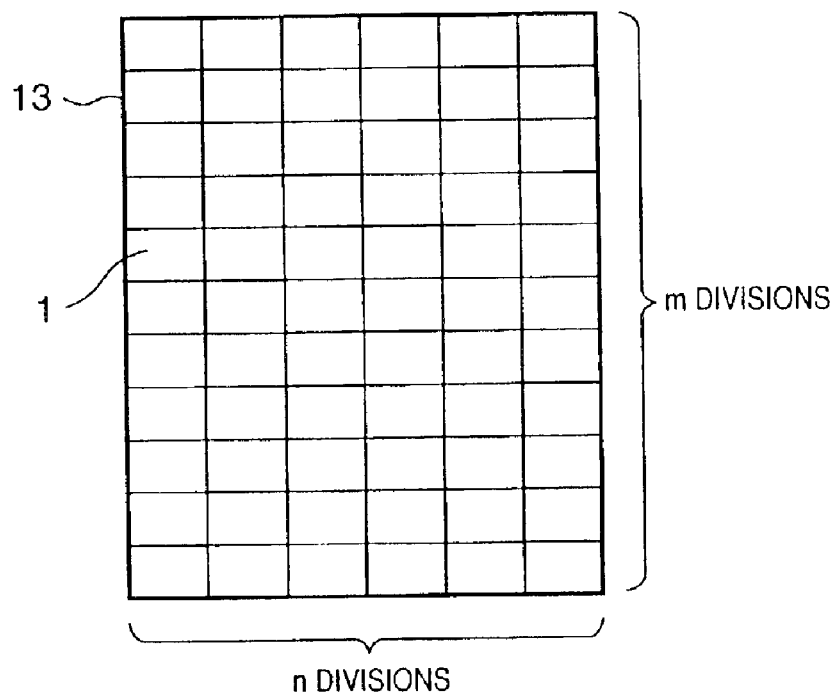
FIG. 4 is an explanatory view of a shot which can obtain a plurality of chips.

FIG. 4 shows a view of one shot. In the shot shown in FIG. 4, the area is divided into n number of divisions in the X direction, and m number of divisions in the Y direction. One shot 13 includes n×m (6×11 in FIG. 4) rectangular chips 1.

Figure 5:
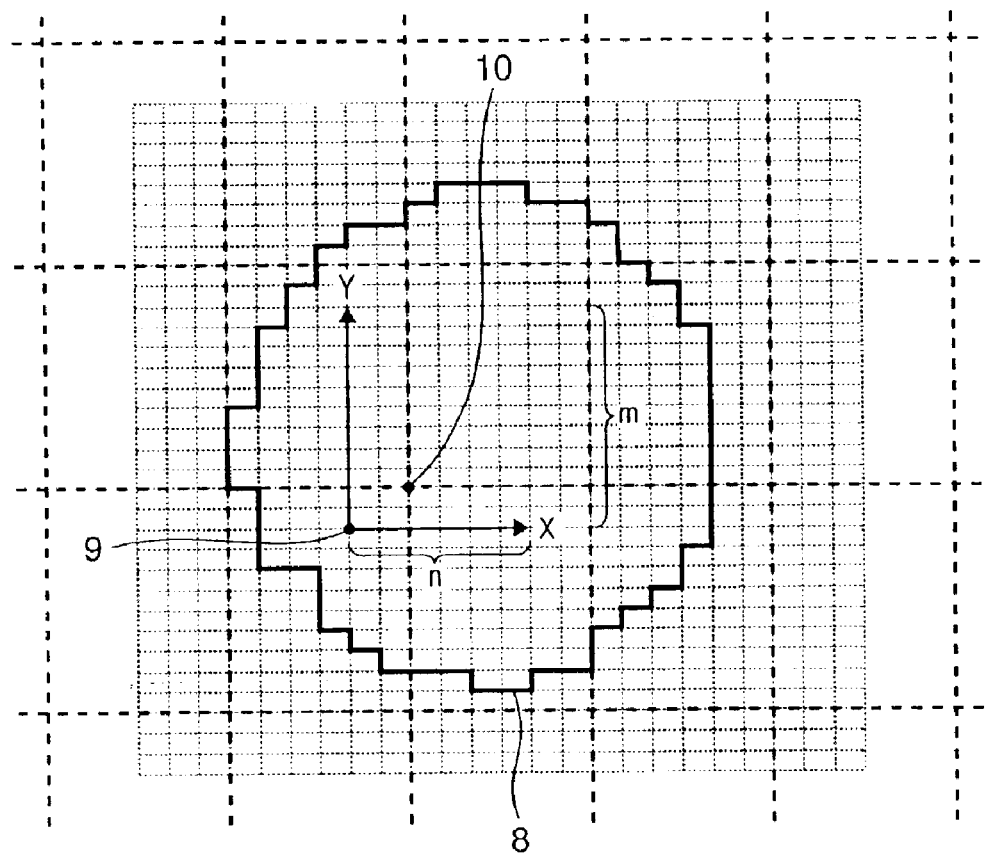
FIG. 5 is an explanatory view of a procedure for obtaining an optimum chip arrangement.

In a case wherein one shot is divided by a plurality of chips, there are as many types of shot arrangements as the number of divisions. Therefore, it is necessary to determine n×m types of shot arrangements. More specifically, as shown in FIG. 5, from the state where an intersection point 10 of the shot boundary overlaps an arbitrary chip grid point 9 of the non-defective chip group 8 defined in the wafer coordinate system, the chip arrangement is shifted in the X-axis direction at a pitch corresponding to the X-direction length of the chip up to the number of X-direction shot divisions n, and further shifted in the Y-axis direction at a pitch corresponding to the Y-direction length of the chip up to the number of Y-direction shot divisions m.

In step S111, whether or not the entire wafer surface is to be exposed is determined. If YES, the control proceeds to step S112. If NO, the control proceeds to step S116.

Figure 6:
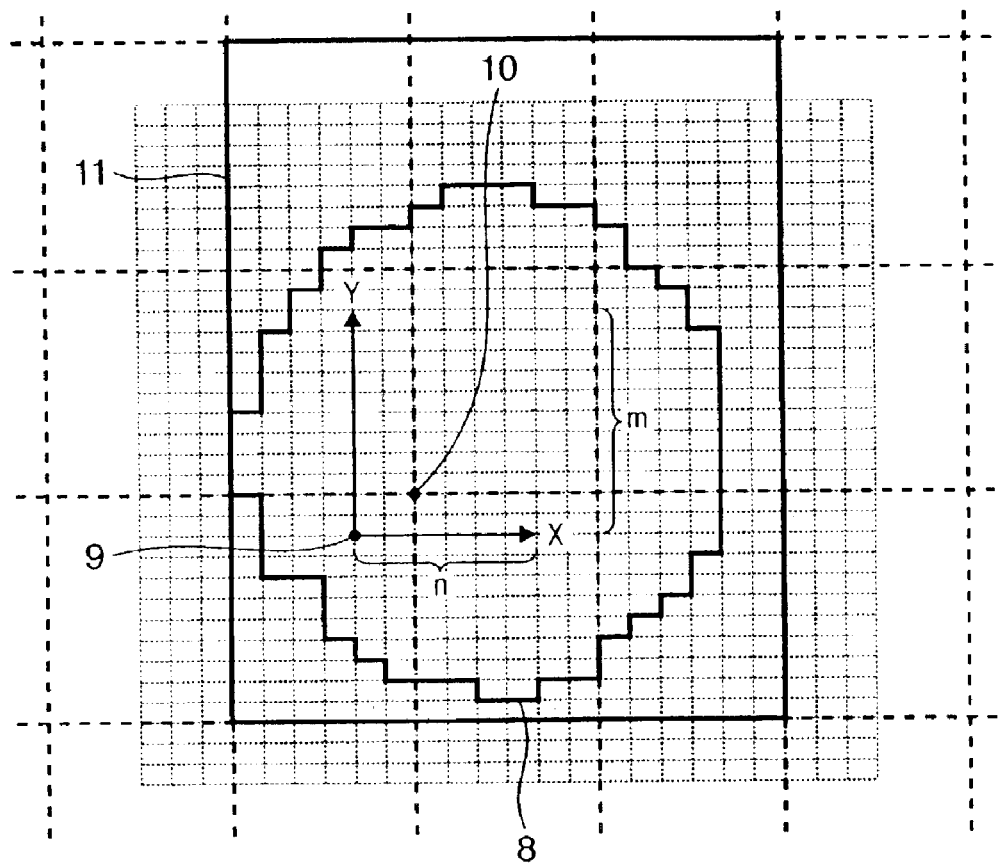
FIG. 6 is an explanatory view of a procedure for obtaining an optimum shot arrangement.

If the entire wafer surface is not to be exposed, n×m types of shot arrangements are set as described above (step S116). With respect to each shot arrangement, the number of shots included in the shot group 11 that covers the chip group 8 as shown in FIG. 6 is calculated (steps S117 and S118). From the n×m types of shot arrangements, a shot arrangement that requires the minimum number of shots is selected. As a result, the optimum shot arrangement is obtained (step S119).

Next, a description is provided of a method of obtaining a shot arrangement for exposing the entire surface of the valid exposure area of the wafer in the minimum number of shots while covering a predetermined chip arrangement. This process, corresponding to exposing the entire wafer surface, is realized by executing step S112 and the following steps in the flowchart in FIG. 1B.

Figure 7:
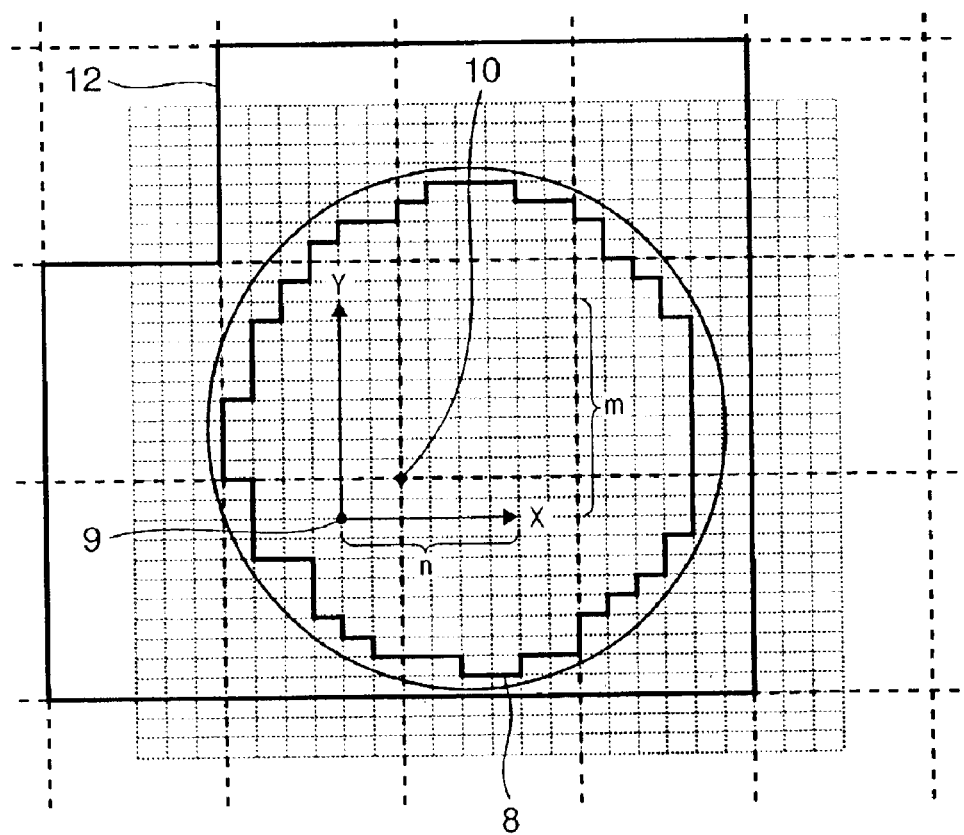
FIG. 7 is an explanatory view of a procedure for obtaining an optimum shot arrangement under a condition of an entire-surface of a wafer.

In this case also, there arc as many types of shot arrangements as the number of divisions. Therefore, in step S113, n×m types of shot arrangements are set in the similar procedure to step S116. More specifically, as shown in FIG. 7, from the state where an intersection point of the shot boundary overlaps an arbitrary grid point of the non-defective chip group 8 defined in the wafer coordinate system, the chip arrangement is shifted in the X-axis direction at a pitch corresponding to the X-direction length of the chip up to the number of X-direction shot divisions n, and further shifted in the Y-axis direction at a pitch corresponding to the Y-direction length of the chip up to the number of Y-direction shot divisions m.

With respect to each shot arrangement, the number of shots included in a shot group 12, which consists of shot arrangements that are at least partially included in the valid exposure area, is calculated (steps S113 and S114). From the n×m types of shot arrangements, a shot arrangement that requires the minimum number of shots is selected. As a result, the optimum shot arrangement is obtained (step S115).

The chip arrangement and shot arrangement determining procedure is performed in the foregoing manner according to the present embodiment. In determining a chip arrangement that maximizes the number of chips acquirable from a given wafer, the key factor of the present embodiment is in that, by limiting the determination to a case where two end points in the group of acquirable chips are included in the boundary line of the valid exposure area, a problem of a consecutive relative-position search of the chip arrangement and wafer by nature is turned into a discrete problem, and as a result, searching the finite number of combinations can lead to a strictly optimum chip arrangement.

Hereinafter, an embodiment of determining a chip arrangement and a shot arrangement by the above-described technique is described in comparison with the arrangement determined by the conventional technique.

<Embodiments of Chip Arrangement/Shot Arrangement Determining Process>

Figure 8:
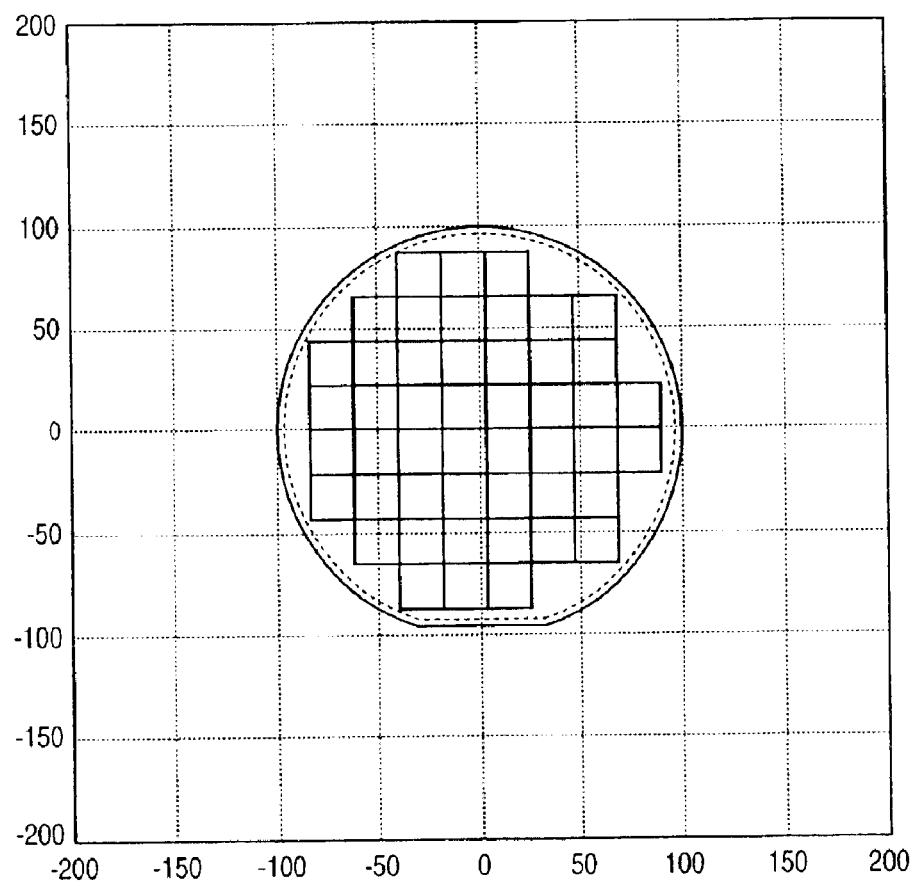
FIG. 8 is a view showing an example of an optimum chip arrangement obtained.

The first embodiment describes a simple example in which there is only one chip in one shot. A condition provided is as follows: a wafer diameter is 200 mm; an invalid width from an outer edge is 3 mm (i.e., diameter 2R of the valid area=194 mm); a depth of an orientation flat is 5 mm; and each of the vertical and horizontal lengths of a chip is 22 mm. Under this condition, an arrangement that maximizes the number of acquirable chips is obtained by the method according to the above-described embodiment. The result is shown in FIG. 8. According to this shot arrangement, coordinates of the center position of the top right shot are (14.65 mm, 77.20 mm) in the wafer coordinate system having its origin at the center of the wafer. The number of acquirable chips is forty-eight.

Figure 9:
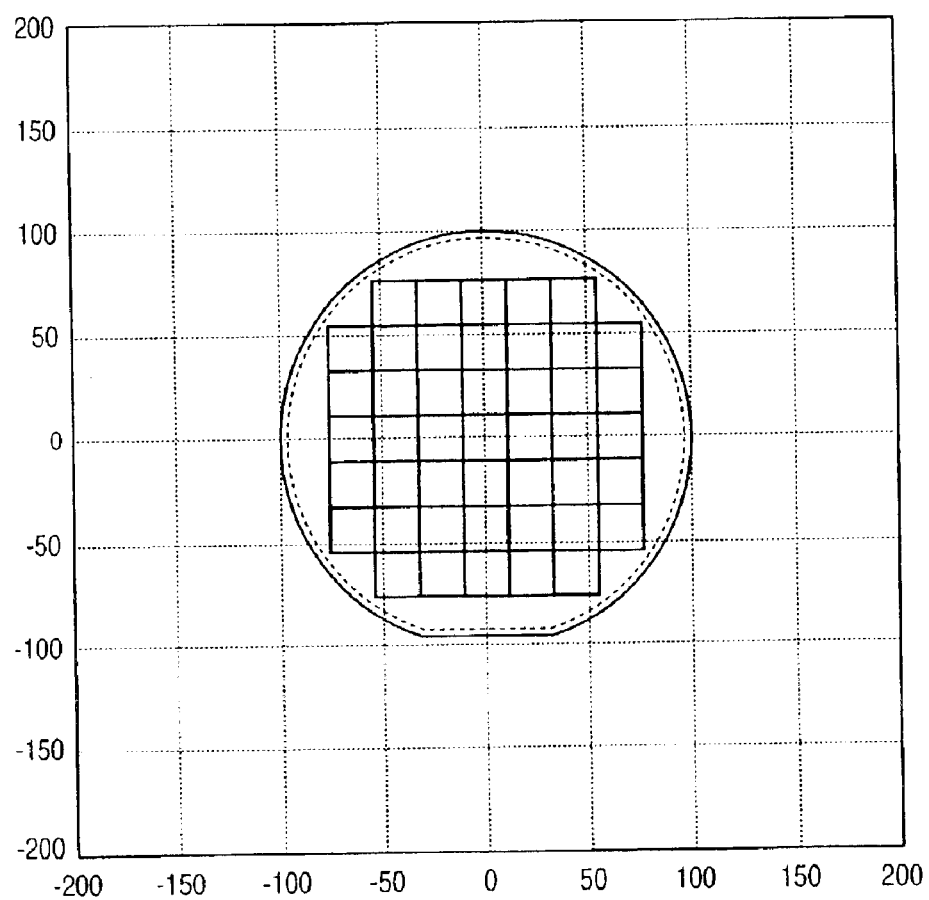
FIG. 9 is a view showing an example of a conventional chip arrangement.

On the contrary, FIG. 9 shows an arrangement obtained by the conventional method. According to this shot arrangement, coordinates of the center position of the top right shot are (44.00 mm, 66.00 mm) in the wafer coordinate system having its origin at the center of the wafer. The number of acquirable chips is forty-five. Therefore, the first embodiment increases the number of acquirable chips by three, and achieves the cost reduction rate of 6.3%.

Figure 10:
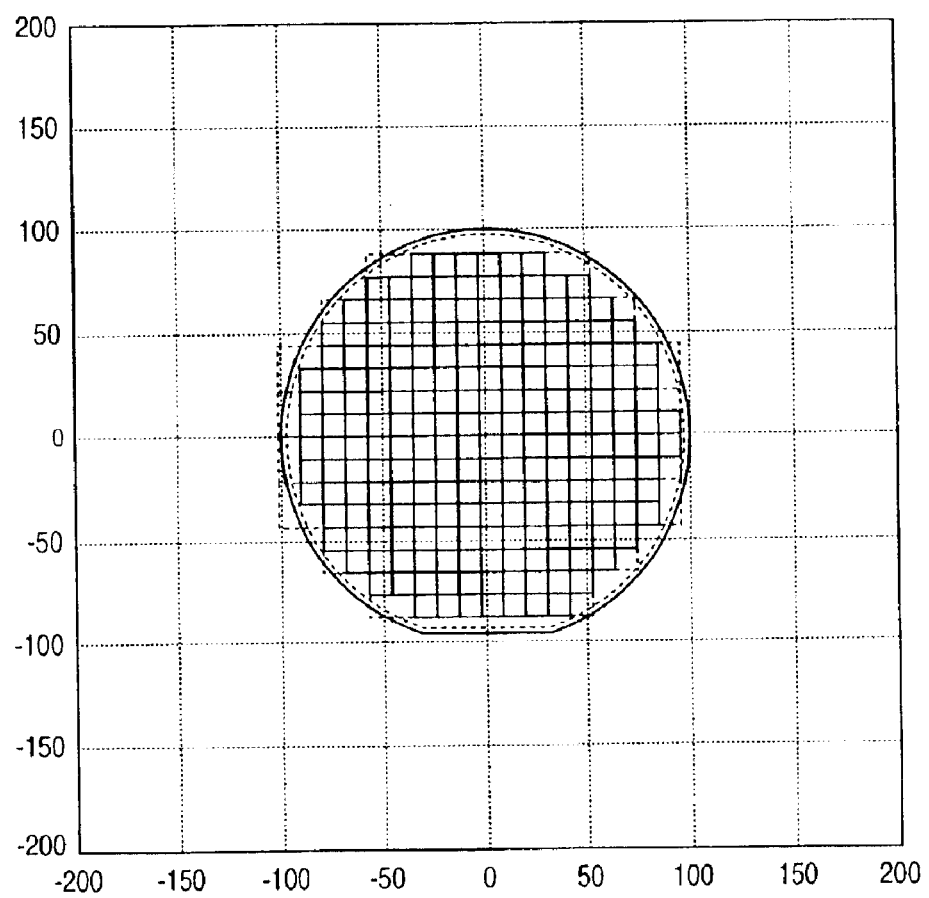
FIG. 10 is a view showing an example of an optimum chip arrangement and a shot arrangement.

The second embodiment describes an example in which four chips (each of the vertical and horizontal lengths of each chip is 11 mm) are exposed in one shot. A condition provided is as follows: a wafer diameter is 200 mm; an invalid width from an outer edge is 3 mm; a depth or orientation flat is 5 mm; and each of the vertical and horizontal lengths of a shot is 22 mm. Under this condition, an arrangement that maximizes the number of acquirable chips and that requires the minimum number of exposure shots is obtained by the method according to the above-described embodiment. The result is shown in FIG. 10. According to this shot arrangement, coordinates of the center position of the top right shot are (43.31 mm, 77.29 mm) in the wafer coordinate system having its origin at the center of the wafer. The number of acquirable chips is 213, and the number of exposure shots is 60.

Figure 11:
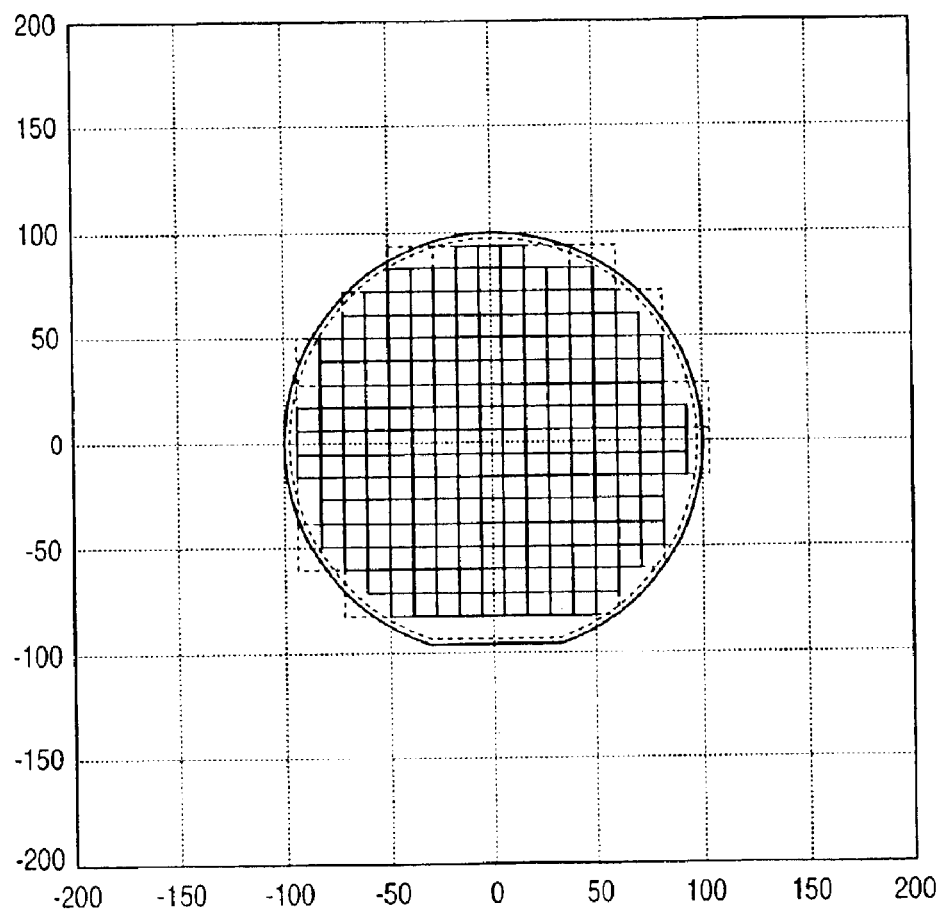
FIG. 11 is a view showing an example of a conventional chip arrangement and a shot arrangement.

On the contrary, FIG. 11 shows an arrangement obtained by the conventional method under the above-described condition. According to this shot arrangement, coordinates of the center position of the top right shot are (49.50 mm, 82.50 mm) in the wafer coordinate system having its origin at the center of the wafer. The number of acquirable chips is 210, and the number of exposure shots is 60. Therefore, the second embodiment increases the number of acquirable chips by three, and achieves the cost reduction rate of 1.4%.

Figure 12:
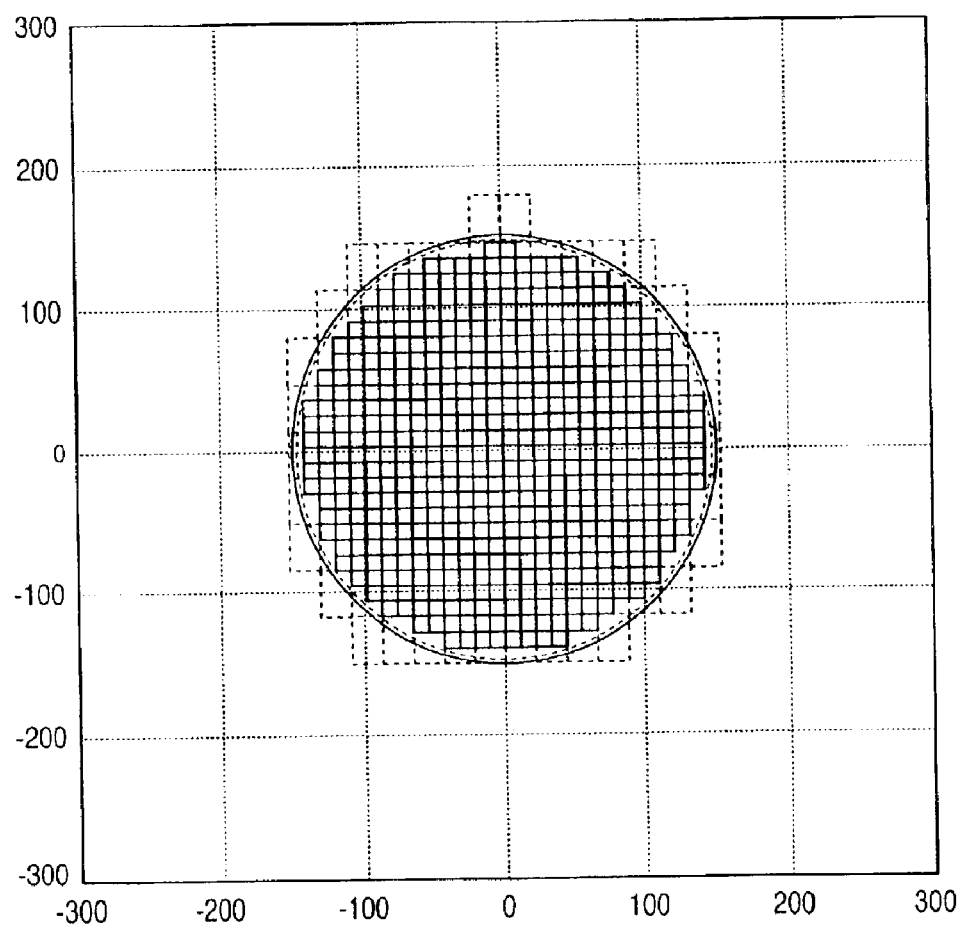
FIG. 12 is a view showing an example of an optimum chip arrangement and a shot arrangement under a condition of an entire-surface exposure of a wafer.

The third embodiment describes an example wherein six chips (each of the vertical and horizontal lengths of each chip is 11 mm) are exposed in one shot. A condition provided is as follows: a wafer diameter is 300 mm; an invalid width from an outer edge is 3 mm; no orientation flat; the vertical length of a shot is 33 mm; and the horizontal length of a shot is 22 mm. Under this condition, an arrangement that maximizes the number of acquirable chips and that requires the minimum number of exposure shots is obtained by the method according to the above-described embodiment. The result is shown in FIG. 12. According to this shot arrangement, coordinates of the center position of the top right shot are (12.00 mm, 163.00 mm) in the wafer coordinate system having its origin at the center of the wafer. The number of acquirable chips is five hundred fifteen, and the number of exposure shots is one hundred fifteen.

Figure 13:
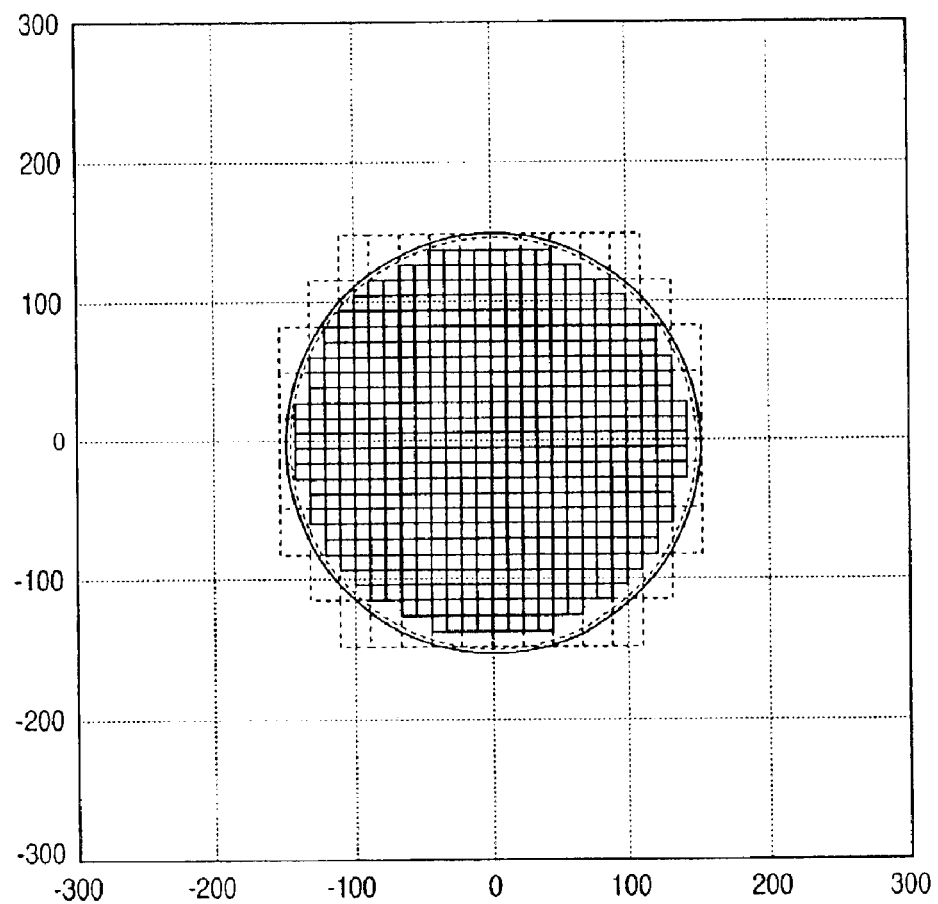
FIG. 13 is a view showing an example of a conventional chip arrangement and a shot arrangement under a condition of an entire-surface exposure of a wafer.

On the contrary, FIG. 13 shows a chip arrangement and a shot arrangement obtained by the conventional method under the above-described condition. According to this shot arrangement, coordinates of the center position of the top right shot are (99.00 mm, 192.00 mm) in the wafer coordinate system having its origin at the center of the wafer. The number of acquirable chips is five hundred ten, and the number of exposure shots is one hundred fourteen. Therefore, the third embodiment increases the number of acquirable chips by five, and achieves the cost reduction rate of 0.97%.

<Semiconductor Device Manufacturing Apparatus and Method>

Figure 15:
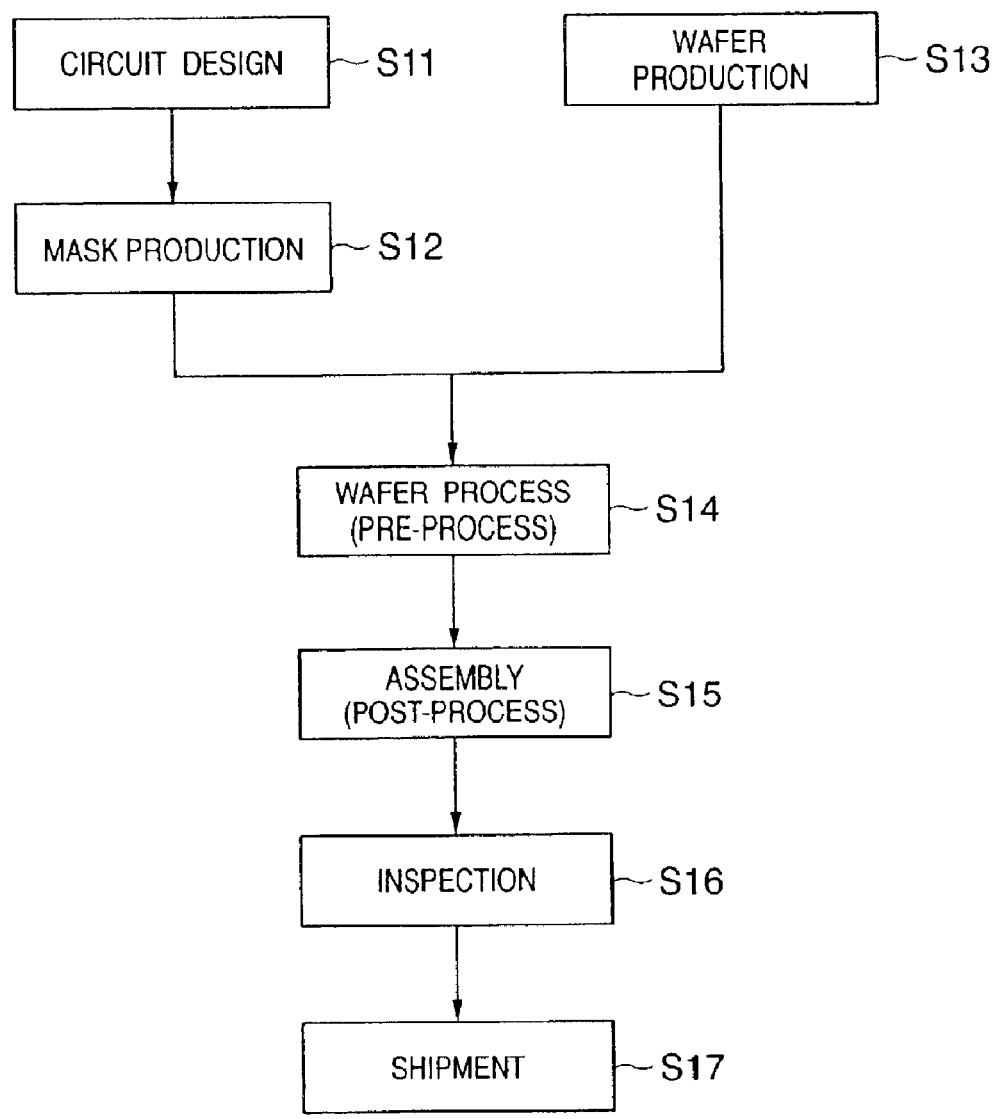
FIG. 15 is a flowchart of a semiconductor device production method.

Described next is an embodiment of a device manufacturing method employing the aforementioned aligner system. FIG. 15 shows a production flow of micro devices (e.g., semiconductor chips such as ICs, or LSIs, liquid crystal panels, CCDs, thin-film magnetic heads, micro machines, and so forth).

In step S11 (circuit design), a circuit of a semiconductor device is designed. In step S12 (mask production), a mask on which the designed circuit pattern is formed is produced. Meanwhile, in step S13 (wafer production), a wafer is produced with a material such as silicon. In step S14 (wafer process), which is called a pre-process, an actual circuit is formed on the wafer using the mask and wafer by a lithography technique. In step S15 (assembly), which is called a post-process, a semiconductor chip is manufactured using the wafer produced in step S14. Step S15 includes an assembling process (dicing and bonding), a packaging process (chip embedding), and so on. In step S16 (inspection), the semiconductor device manufactured in step S15 is subjected to inspections, such as an operation-check test, a durability test, and so on. Semiconductor devices are manufactured in the foregoing processes and shipped (step S17).

Figure 16:
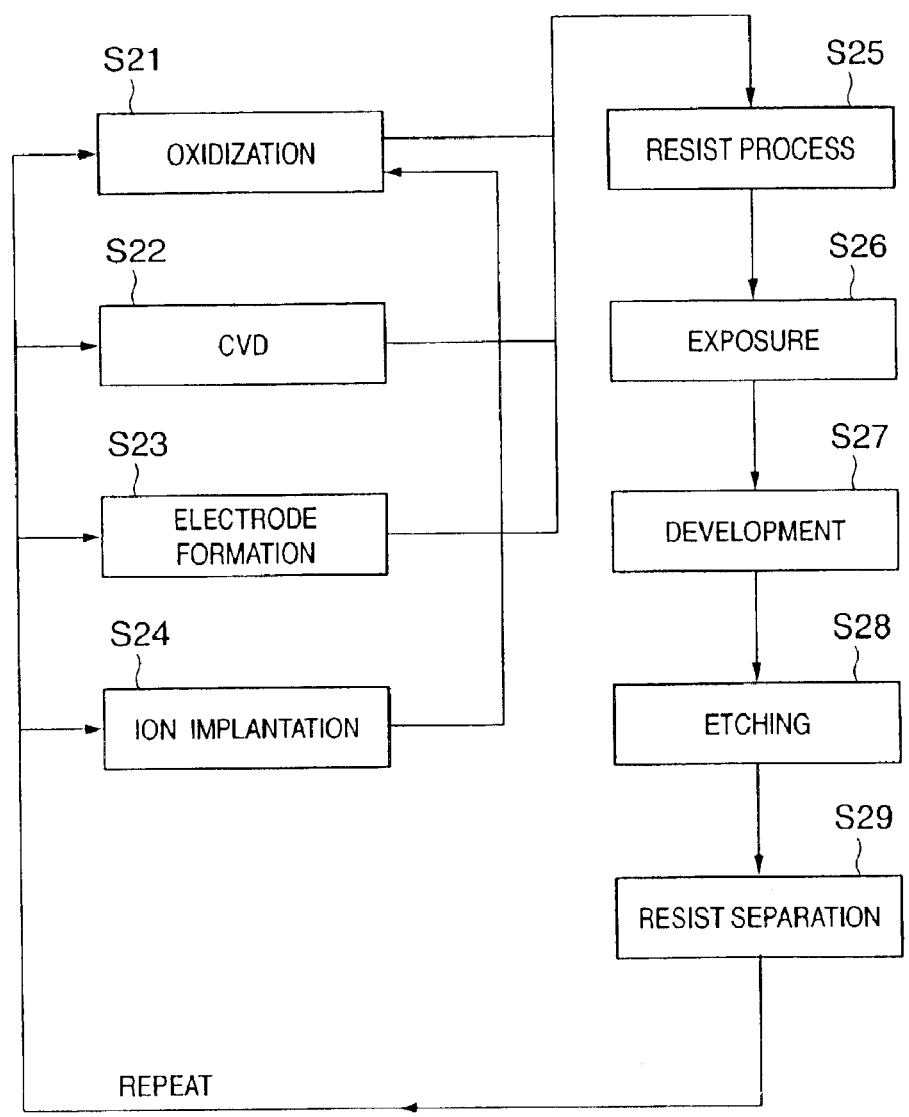
FIG. 16 is a flowchart of a detailed wafer process.

FIG. 16 shows a flow of the aforementioned wafer process in detail. In step S21 (oxidation), the wafer surface is oxidized. In step S22 (CVD), an insulating film is deposited on the wafer surface. In step S23 (electrode formation), electrodes are deposited on the wafer. In step S24 (ion implantation), ions are implanted on the wafer. In step S25 (resist process), a photosensitive agent is coated on the wafer. In step S26 (exposure), the circuit pattern of the mask is exposed on the wafer by the above-described aligner. In step S27 (development), the exposed wafer is developed. In step S28 (etching), portions other than the developed resist image are removed. In step S29 (resist separation), unnecessary resist after the etching process is removed. By repeating the foregoing steps, multiple circuit patterns are formed on the wafer.

The manufacturing method of this embodiment enables production of highly integrated semiconductor devices, which have been difficult to produce conventionally.

As has been described above, the foregoing embodiments enable determination of a strictly optimum chip arrangement and a strictly optimum shot arrangement, which ultimately contribute to cost reduction in semiconductor chip manufacturing.

<Other Embodiment>

The objects of the present invention can also be achieved by providing a storage medium, storing program codes of software realizing the above-described functions of the embodiments (chip arrangement/shot arrangement determining process), to a computer system or apparatus, reading the program codes stored in the storage medium, by a CPU or MPU of the computer system or apparatus, and executing the program.

In this case, the program codes read from the storage medium realize the functions according to the embodiments, and the storage medium storing the program codes constitutes the invention.

For the storage medium providing the program codes, a floppy disk, a hard disk, an optical disk, a magneto-optical disk, a CD-ROM, a CD-R, a magnetic tape, a non-volatile type memory card, and a ROM can be used.

Furthermore, besides the aforesaid functions according to the above embodiments are realized by executing the program codes which are read by a computer, the present invention includes a case wherein an OS (operating system), or the like, working on the computer performs a part of or the entire processes in accordance with designations of the program codes and realizes functions according to the above embodiments.

Furthermore, the present invention also includes a case wherein, after the program codes read from the storage medium are written in a function expansion card which is inserted into the computer or in a memory provided in a function expansion unit, which is connected to the computer, a CPU, or the like, contained in the function expansion card or unit performs a part of or the entire process in accordance with designations of the program codes and realizes functions of the above embodiments.

As has been described above, according to the present invention, it is possible to obtain a strictly optimum arrangement of semiconductor chips on a wafer in a short time.

Furthermore, in a case wherein a plurality of chips are projected by a single time of an exposure shot, it is possible to transfer a predetermined chip arrangement in the minimum number of shots, thereby realizing a high throughput. Similarly, it is possible to expose the entire surface of the valid exposure area in the minimum number of shots, while covering the predetermined chip arrangement, thereby realizing a high throughput.

As many apparently widely different embodiments of the present invention can be made without departing from the spirit and scope thereof, it is to be understood that the invention is not limited to the specific embodiments thereof except as defined in the claims.

What is claimed is:

1. A method of determining a chip arrangement on a wafer, said method comprising steps of:

generating a grid array in which rectangles are arranged in a grid pattern, the rectangle corresponding to a chip in size, an apex of the rectangle being a grid point;

extracting a plurality of the grid points, having respective distances, from an origin, not greater than a constant defined by an available area on the wafer, from the grid array;

forming a region, of which a region corresponds to the available area and which has the original and one of the extracted grid points on its circumference, on the grid array, with respect to each of the plurality of the grid points extracted in said extracting step; and determining a chip arrangement on the wafer based on the region, which includes a maximum number of the rectangles, formed in said forming step.

2. A method according to claim 1, wherein, in said extracting step, the plurality of grid points are extracted from a first quadrant of an xy coordinate system set along with the grid array, the origin being an origin, of the xy coordinate system, set on one of the grid points, a region of the available area being a circle, the constant being a diameter of the circle.

3. A method according to claim 1, further comprising a second determining step of determining an arrangement of a shot region, including a plurality of chip regions, so that an entire chip arrangement determined in said determining step is covered in a minimum number of the shot regions.

4. A method according to claim 3, wherein, in said second determining step, the arrangement of the shot region is determined so that an entire surface of the available area is covered in a minimum number of the shot regions.

5. A method according to claim 3, wherein, in said second determining step, the arrangement of the shot region is selected from n×m arrangements, where n and m are natural numbers, respectively, and the shot region includes n×m chip regions.

6. A method according to claim 1, wherein the available area on the wafer is defined by a circular arc and a chord which corresponds to the circular arc.

7. An apparatus for determining a chip arrangement on a wafer, said apparatus comprising:

generating means for generating a grid array in which rectangles are arranged in a grid pattern, the rectangle corresponding to a chip in size, an apex of the rectangle being a grid point;

extracting means for extracting a plurality of the grid points, having respective distances, from an origin, not greater than a constant defined by an available area on the wafer, from the grid array;

forming means for forming a region, of which a region corresponds to the available area and which has the origin and one of the extracted grid points on its circumference, on the grid array, with respect to each of the plurality of grid points extracted by said extracting means; and determining means for determining a chip arrangement on the wafer based on the region, which includes a maximum number of the rectangles, formed by said forming means.

8. An apparatus according to claim 7, wherein said extracting means extracts the plurality of the grid points from a first quadrant of an xy coordinate system set along with the grid array, the origin being an origin, of the xy coordinate system, set on one of the grid points, a region of the available area being a circle, the constant being a diameter of the circle.

9. An apparatus according to claim 7, further comprising second determining means for determining an arrangement of a shot region, including a plurality of chip regions, so that an entire chip arrangement determined by said determining means is covered in a minimum number of the shot regions.

10. An apparatus according to claim 9, wherein said second determining means determines the arrangement of the shot region so that an entire surface of the available area is covered in a minimum number of the shot regions.

11. An apparatus according to claim 9, wherein said second determining means selects the arrangement of the shot region from n×m arrangements, where n and m are natural numbers, respectively, and the shot region includes n×m chip regions.

12. An apparatus according to claim 7, wherein the available area on the wafer is defined by a circular arc and a chord which corresponds to the circular arc.

13. An exposure apparatus comprising:

a determining unit which determines a chip arrangement on a wafer;

an exposure unit which exposes a wafer to a pattern in accordance with a chip arrangement determined by said determining unit, wherein said determining unit comprises:

generating means for generating a grid array in which rectangles are arranged in a grid pattern, the rectangle corresponding to a chip in size, an apex of the rectangle being a grid point;

extracting means for extracting a plurality of the grid points, having respective distances, from an origin, not greater than a constant defined by an available area on the wafer, from the grid array;

forming means for forming a region, of which a region corresponds to the available area and which has the origin and one of the extracted grid points on its circumference, on the grid array with respect to each of the plurality of the grid points extracted by said extracting means; and determining means for determining a chip arrangement on the wafer based on the region, which includes a maximum number of the rectangles, formed by said forming means.

14. A device manufacturing method comprising steps of:

determining a chip arrangement on a wafer;

exposing the wafer to a pattern in accordance with a chip arrangement determined in said determining step; and developing the wafer exposed in said exposing step, wherein said determining step comprises steps of:

generating a grid array in which rectangles are arranged in a grid pattern, the rectangle corresponding to a chip in size, an apex of the rectangle being a grid point;

extracting a plurality of the grid points, having respective distances, from an origin, not greater than a constant defined by an available area on the wafer, from the grid array;

forming a region, of which a region corresponds to the available area and which has the origin and one of the extracted grid points on its circumference on the grid array with respect to each of the plurality of the grid points extracted in said extracting step; and determining a chip arrangement on the wafer based on the region, which includes a maximum number of the rectangles, formed in said forming step.

15. A program for causing a computer to execute a method of determining a chip arrangement on a wafer, said method comprising steps of:

generating a grid array in which rectangles are arranged in a grid pattern, the rectangle corresponding to a chip in size, an apex of the rectangle being a grid point;

extracting a plurality of the grid points, having respective distances, from an origin, not greater than a constant defined by an available area on the wafer, from the grid array;

forming a region, of which a region corresponds to the available area and which has the origin and one of the extracted grid points on its circumference, on the grid array with respect to each of the plurality of the grid points extracted in said extracting step; and determining a chip arrangement on the wafer based on a region, which includes a maximum number of the rectangles, formed in said forming step.

16. A device manufactured by a device manufacturing method, said method comprising steps of:

determining a chip arrangement on a wafer;

exposing the wafer to a pattern in accordance with a chip arrangement determined in said determining step; and developing the exposed wafer in said exposing step, wherein said determining step comprises steps of:

generating a grid array in which rectangles are arranged in a grid pattern, the rectangle corresponding to a chip in size, an apex of the rectangle being a grid point;

extracting a plurality of the grid points, having respective distances, from an origin, not greater than a constant defined by an available area on the wafer, from the grid array;

forming a region, of which a region corresponds to the available area and which has the origin and one of the extracted grid points on its circumference, on the grid array with respect to each of the plurality of the grid points extracted in said extracting step; and determining a chip arrangement on the wafer based on the region, which includes a maximum number of the rectangles, formed in said forming step.

* * * * *

UNITED STATES PATENT AND TRADEMARK OFFICE
CERTIFICATE OF CORRECTION

PATENT NO. : 6,854,105 B2
DATED : February 8, 2005
INVENTOR(S) : Youzou Fukagawa It is certified that error appears in the above-identified patent and that said Letters Patent is hereby corrected as shown below:

Column 1,
Line 38, "2000195824," should read -- 2000-195824, --.

Column 4,
Line 32, "which,is" should read -- which is --.
Line 34, "exposure." should read -- exposure area. --.

Column 5,
Line 47, "arc" should read -- are --.

Column 6,
Line 5, "in" should be deleted.

Column 11,
Line 6, the second occurrence of "a" should read -- the --.

Signed and Sealed this

Nineteenth Day of July, 2005

JON W. DUDAS
*Director of the United States Patent and Trademark Office*